US008541798B2

(12) United States Patent
Ooya et al.

(10) Patent No.: US 8,541,798 B2
(45) Date of Patent: Sep. 24, 2013

(54) SEMICONDUCTOR LIGHT EMITTING DEVICE, AND BACKLIGHT AND DISPLAY DEVICE COMPRISING THE SEMICONDUCTOR LIGHT EMITTING DEVICE

(75) Inventors: Yasumasa Ooya, Chigasaki (JP); Ryo Sakai, Yokohama (JP); Hajime Takeuchi, Yokohama (JP); Tsutomu Ishii, Yokohama (JP); Yasuhiro Shirakawa, Yokohama (JP)

(73) Assignees: Kabushiki Kaisha Toshiba, Tokyo (JP); Toshiba Materials Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/442,335

(22) PCT Filed: Sep. 27, 2007

(86) PCT No.: PCT/JP2007/068752
§ 371 (c)(1),
(2), (4) Date: Dec. 18, 2009

(87) PCT Pub. No.: WO2008/038691
PCT Pub. Date: Apr. 3, 2008

(65) Prior Publication Data
US 2010/0102340 A1    Apr. 29, 2010

(30) Foreign Application Priority Data
Sep. 27, 2006   (JP) .................................. 2006-262657

(51) Int. Cl.
*H01L 33/00*    (2010.01)
(52) U.S. Cl.
USPC ................. 257/98; 257/89; 257/99; 257/100; 257/E33.06

(58) Field of Classification Search
USPC ........................... 257/89, 98, 99, 100, E33.06
See application file for complete search history.

(56) References Cited

U.S. PATENT DOCUMENTS

| 2003/0201451 A1* | 10/2003 | Suehiro et al. | 257/98 |
| 2005/0051790 A1* | 3/2005 | Ueda | 257/99 |
| 2006/0244712 A1* | 11/2006 | Cho et al. | 345/102 |

FOREIGN PATENT DOCUMENTS

| JP | 2003-315796 | 11/2003 |
| JP | 2004-048040 | * 2/2004 |

(Continued)

OTHER PUBLICATIONS

International Preliminary Report on Patentability and Written Opinion issued by the International Bureau of WIPO on Apr. 9, 2009, for International Application No. PCT/JP2007/068752.

(Continued)

*Primary Examiner* — Tan N Tran
(74) *Attorney, Agent, or Firm* — Finnegan, Henderson, Farabow, Garrett & Dunner, L.L.P.

(57) ABSTRACT

The present invention provides a semiconductor light emitting device comprising a light intensity difference reducing layer provided between an ultraviolet semiconductor light emitting element and a wavelength converting material layer, and a backlight and a display device comprising the semiconductor light emitting device. The semiconductor light emitting device is an LED light emitting device which has improved uniformity of emitted light and reduced non-uniformity of brightness and chromaticity of emitted light. The light emitting device according to the present invention is particularly suitable for use in various display devices, preferably, for example, in display devices in equipment where a reduction in size, a reduction in weight, a reduction in thickness, electric power saving, high brightness, and excellent color rendering properties are particularly required, for example, cellular phones, personal digital assistants, electronic dictionaries, digital cameras, computers, liquid crystal televisions (TVs), and peripheral devices of these devices.

7 Claims, 3 Drawing Sheets

(56) References Cited

FOREIGN PATENT DOCUMENTS

| | | |
|---|---|---|
| JP | 2004-207341 | 7/2004 |
| JP | 2004-221163 | 8/2004 |
| JP | 2005-277331 | 10/2005 |
| JP | 2006-186297 | 7/2006 |
| JP | 2006-210627 | 8/2006 |

OTHER PUBLICATIONS

An Office Action issued by the Taiwan Patent Office on Aug. 15, 2011, for Taiwanese Patent Application No. 097107648 and English-language translation thereof.

An Office Action issued by the Taiwanese Patent Office on Oct. 17, 2012, for Taiwanese Patent Application No. 097107648, and English-language translation thereof.

An Office Action issued by the Japanese Patent Office on Sep. 7, 2012, for Japanese Patent Application No. 2008-536407, and English-language translation thereof.

Decision on Trial issued by the Korean Patent Office on Mar. 25, 2013, for Korean Patent Application No. 2009-7007462, and partial English-language translation thereof.

Decision of Rejection issued by the Japanese Patent Office on Apr. 23, 2013, for Japanese Patent Application No. 2008-536407, and English-language translation thereof.

* cited by examiner

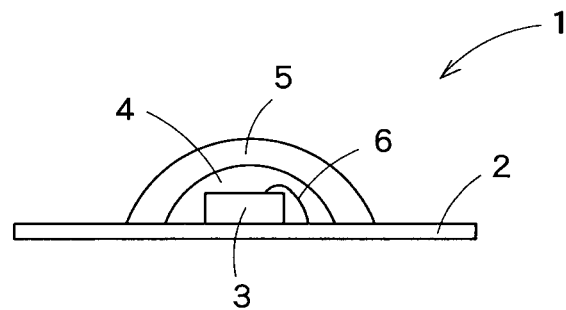
F I G. 1
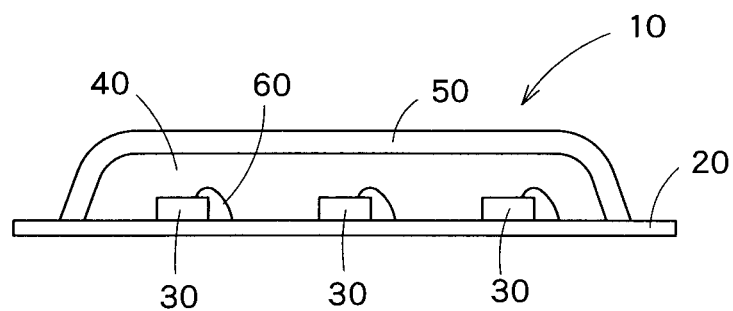
F I G. 2
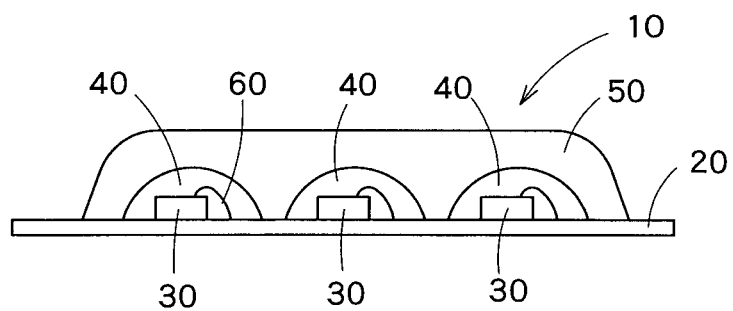
F I G. 3

RESULTS OF EVALUTION UNEVEN COLOR IN EXAMPLE 2

CIE CHROMATICITY DIAGRAM

SEMICONDUCTOR LIGHT EMITTING DEVICE, AND BACKLIGHT AND DISPLAY DEVICE COMPRISING THE SEMICONDUCTOR LIGHT EMITTING DEVICE

TECHNICAL FIELD

The present invention relates to a semiconductor light emitting device, and a backlight and a display device using the semiconductor light emitting device. More particularly, the present invention relates to a semiconductor light emitting device having no significant nonuniform brightness and color of emitted light and a backlight and a display device using the semiconductor light emitting device.

BACKGROUND ART

Light emitting diodes (hereinafter referred to as "LEDs") are semiconductor elements that convert electric energy to light such as ultraviolet light or visible light which is then radiated. An LED lamp comprising a chip of the LED sealed, for example, with a transparent resin is used in various fields. The LED chip is a semiconductor element and thus has a prolonged service life, is highly reliable, and, when used as a light source, can reduce replacement work and the like. Accordingly, the LED chip is becoming widely used as components constituting various display devices such as portable communication equipment, personal computer (PC) peripheral equipment, office automation (OA) apparatuses, domestic electric appliances, signal devices, various switches, and backlight-type display plates.

At the present time, cold-cathode tubes are mainly used in liquid crystal backlights among the above display devices. The cold-cathode tubes contain, for example, mercury and thus are harmful to an environment. On the other hand, as described above, LEDs have many advantages, and, thus, changeover to LEDs has been extensively and intensively studied. The LEDs, however, are inferior in the light intensity difference and brightness uniformity of emitted light to the cold-cathode tubes. Solving these problems is a task necessary to fully apply and develop the LEDs.

There are mainly three types of non-uniformity of emitted light which pose a problem associated with LEDs. The first type of non-uniformity is derived from the fact that LEDs are a small point light source having a typical approximate size of 0.3 mm×0.3 mm×0.25 mm per LED. In use, a plurality of LEDs are generally arrayed on a substrate. No matter how the LEDs are arrayed, a complete line light source or a surface light source cannot be provided. This poses a problem that non-uniformity of brightness occurs due to the presence of a part where a bright light is emitted by LEDs, and a non-light emitting part present between the LED and the other LED.

The second type of non-uniformity is due to a brightness uniformity of light emission by the LED per se. LEDs are usually used in a shape of a rectangular parallelopiped or a shape close to a rectangular parallelopiped. The intensity of light emitted from each face of the rectangular parallelopiped is different from face to face, leading to a difference in brightness of emitted light between directions in which light is taken out from the LED.

The third type of non-uniformity is due to a color uniformity of emitted light. The color uniformity is a problem involved in a combination of LED with a wavelength converting material such as a phosphor material to emitt, for example, white light. For example, an example of a technique for emitting white light, which has been put to practical use up to now, is one disclosed in Japanese Patent Laid-Open No. 315796/2003. The invention described in this publication is directed to a technique in which a white light is provided by combining a blue light emitting LED with a yellow light emitting phosphor, for example, YAG. This technique, however, is disadvantageous in that, when the emitted light is viewed in a certain direction, the emitted light is seen as a yellowish color, and nonuniform yellow and blue colors appear upon projection on a white surface. For this reason, this type of white LED lamps are sometimes called a pseudo white light lamp.

Among the above drawbacks of the LEDs which are disadvantages over cold-cathode tubes, the problem of brightness can be solved to a certain extent by using a number of LEDs. On the other hand, any effective measure for eliminating the problem of non-uniformity of the emitted light has not been proposed, and the problem of non-uniformity of the emitted light has been a big problem.

[Patent document 1] Japanese Patent Laid-Open No. 315796/2003

DISCLOSURE OF INVENTION

Problems to be Solved by the Invention

The present invention has been made with a view to solving the above problems of the prior art, and an object of the present invention is to provide a semiconductor light emitting device having improved uniformity of emitted light. More specifically, the present invention has been made with a view to providing a multicolor light emitting device which can improve the problem of non-uniformity of emitted light and, at the same time, has excellent color rendering properties and can emit brighter and natural light.

Means for Solving the Problems

According to the present invention, there is provided a semiconductor light emitting device comprising a an ultraviolet semiconductor light emitting element, a wavelength converting material layer and a light intensity difference reducing layer provided between the ultraviolet semiconductor light emitting element and the wavelength converting material layer, wherein the wavelength converting material layer containing a wavelength converting material comprising at least one of three types of phosphors which, upon absorption of ultraviolet light emitted from the ultraviolet semiconductor light emitting element, emit red light, blue light, and green light, respectively.

In the semiconductor light emitting device according to the present invention, preferably, the light intensity difference reducing layer is formed of a transparent resin material.

In the semiconductor light emitting device according to the present invention, preferably, the wavelength converting material layer is formed of a dispersion, in a transparent resin material, of the wavelength converting material comprising at least one of three types of phosphors which, upon absorption of ultraviolet light emitted from the ultraviolet semiconductor light emitting element, emit red light, blue light, and green light, respectively.

In the semiconductor light emitting device according to the present invention, preferably, a plurality of the ultraviolet semiconductor light emitting elements are provided on a substrate, a continuous layer of the light intensity difference reducing layer is provided to cover any two or more of the plurality of the ultraviolet semiconductor light emitting elements, and a continuous layer of the wavelength converting material layer is provided to cover the continuous layer of the light intensity difference reducing layer.

In the semiconductor light emitting device according to the present invention, preferably, a plurality of the ultraviolet semiconductor light emitting elements are provided on a substrate, a discontinuous layer of the light intensity difference reducing layer is provided to cover any one or at least two of the plurality of the ultraviolet semiconductor light emitting elements, and a continuous layer of the wavelength converting material layer is provided to cover the discontinuous layer of the light intensity difference reducing layer.

In the semiconductor light emitting device according to the present invention, preferably, the light intensity difference reducing layer is provided to cover both the ultraviolet semiconductor light emitting element and a wiring connected to the ultraviolet semiconductor light emitting element.

According to another aspect of the present invention, there is provided a backlight comprising any one of the above semiconductor light emitting devices.

According to a further aspect of the present invention, there is provided a display device comprising the above backlight.

Effect of the Invention

In the semiconductor light emitting device according to the present invention, a light intensity difference reducing layer is provided between an ultraviolet semiconductor light emitting element and a wavelength converting material layer. Accordingly, light (including ultraviolet light and the like) produced in the ultraviolet semiconductor light emitting element is rendered uniform during passage through the light intensity difference reducing layer, and thus, uniform light reaches the wavelength converting material layer. Therefore, the uniformity of light emitted from the wavelength converting material can be improved.

The homogenization of light, which reaches the wavelength converting material layer, homogenizes the color of light emitted from a phosphor present in the wavelength converting material layer, and particularly improves an emitted light color balance of a plurality of types of phosphors present in the wavelength converting material layer. Accordingly, a multicolor light emitting device, which has good color rendering properties and can realize more natural color representation, can be provided.

Thus, the light emitting device according to the present invention can be utilized in various applications by utilizing its excellent properties. The light emitting device according to the present invention is particularly suitable for use, for example, as light emitting devices in various display devices, preferably, for example, in equipment where a reduction in size, a reduction in weight, a reduction in thickness, electric power saving, brightness high enough to realize good visibility even in sunlight, and good color rendering properties are particularly required, for example, cellular phones, personal digital assistants, electronic dictionaries, digital cameras, computers, liquid crystal televisions (TVs), and peripheral equipment of these devices.

BRIEF DESCRIPTION OF THE DRAWINGS

FIG. 1 is a cross-sectional view of one particularly preferred embodiment of a semiconductor light emitting device according to the present invention.

FIG. 2 is a cross-sectional view of another particularly preferred embodiment of a semiconductor light emitting device according to the present invention.

FIG. 3 is a cross-sectional view of a further particularly preferred embodiment of a semiconductor light emitting device according to the present invention.

BEST MODES FOR CARRYING OUT THE INVENTION

Figure 4A:
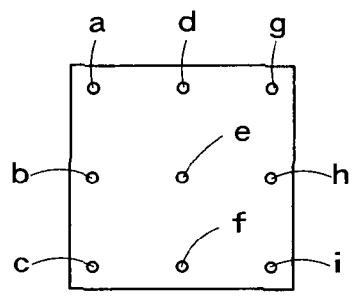
FIG. 4 is a diagram showing the positions of measuring points in evaluating the brightness uniformity of a semiconductor light emitting device.

The semiconductor light emitting device according to the present invention is characterized by providing a light intensity difference reducing layer between an ultraviolet semiconductor light emitting element and a wavelength converting material layer.

A device shown in FIG. 1 may be mentioned as one particularly preferred embodiment of the semiconductor light emitting device according to the present invention. A semiconductor light emitting device 1 according to the present invention shown in FIG. 1 comprises one ultraviolet semiconductor light emitting element 3 provided on a substrate 2, a light intensity difference reducing layer 4 provided on the surface of the ultraviolet semiconductor light emitting element 3, and a wavelength converting material layer 5 provided on the surface of the light intensity difference reducing layer 4.

In the semiconductor light emitting device 1 according to the present invention shown in FIG. 1, an ultraviolet semiconductor light emitting element is particularly preferred as the ultraviolet semiconductor light emitting element 3. Preferably, the wavelength converting material layer 5 contains a wavelength converting material comprising at least one of three types of phosphors which, upon absorption of ultraviolet light emitted from the ultraviolet semiconductor light emitting element 3, emit red light, blue light, and green light, respectively. When a wiring 6 is connected to a surface part of the ultraviolet semiconductor light emitting element 3, preferably, the light intensity difference reducing layer 4 is provided so as to cover both the ultraviolet semiconductor light emitting element 3 and the wiring 6.

<Ultraviolet Semiconductor Light Emitting Element>

Various ultraviolet semiconductor light emitting elements may be utilized. In the present invention, ultraviolet semiconductor light emitting elements having a peak wavelength in a wavelength range of not less than 360 nm and not more than 440 nm in a luminescence spectrum thereof are particularly preferred. Specific examples of such ultraviolet semiconductor light emitting elements include InGaN-based, GaN-based, and AlGaN-based diodes.

Thus, the use of an ultraviolet semiconductor light emitting element having a peak wavelength in a wavelength range of not less than 360 nm and not more than 440 nm in combination with a wavelength converting material which will be described later, can provide a white light emitting device having better color rendering properties.

(Note: Ultraviolet light generally refers to a wavelength range of not more than 400 nm. Many ultraviolet light emitting semiconductor elements exhibit peak wavelengths in a range of up to 440 nm, and luminescence peaks appear on a short wavelength side in a luminescence spectrum, i.e., in an ultraviolet wavelength range of not more than 400 nm. Here such ultraviolet light emitting semiconductor elements refer to ultraviolet semiconductor light emitting elements.

<Wavelength Converting Material Layer>

In the present invention, preferably, the wavelength converting material layer is formed of a dispersion, in a transparent resin material, of a wavelength converting material comprising at least one of three types of phosphors which, upon absorption of ultraviolet light emitted from an ultraviolet semiconductor light emitting element, emit red light, blue light, and green light, respectively. A phosphor which emits red light, a phosphor which emits blue light, and a phosphor which emits green light will be hereinafter referred to as a red light emitting phosphor, a blue light emitting phosphor, and a green light emitting phosphor, respectively.

When a white light is produced by mixing the blue light emitting phosphor, the green light emitting phosphor and the red light emitting phosphor together, the average particle diameter of each of the phosphors is not particularly limited but is preferably not less than 3 μm. When the average particle diameter is not less than 3 μm, that is, when the phosphor particles are large, a high brightness is likely to be provided. There is no particular limitation on the upper limit of the average particle diameter, and the upper limit can be properly determined according to the structure of a white light emitting device according to the present invention. However, when the size of the phosphor particles is excessively large, intimate mixing of the phosphor particles is difficult. Accordingly, the upper limit of the average particle diameter is preferably 100 μm. The mixing ratio among the blue light emitting phosphor, the green light emitting phosphor, and the red light emitting phosphor may be any desired value so far as the ratio can provide a chromaticity suitable as a light emitting element. The mixing ratio, however, is preferably 10 to 25% by weight for the blue light emitting phosphor, 10 to 25% by weight for the green light emitting phosphor, and 50 to 80% by weight for the red light emitting phosphor.

When the blue light emitting phosphor, the green light emitting phosphor, and the red light emitting phosphor each are used as a single color light emitting material, the average particle diameter and the like are not limited.

In a preferred embodiment of the present invention, regarding the combination of the ultraviolet semiconductor light emitting element with the phosphor used in the semiconductor light emitting device according to the present invention, the ultraviolet semiconductor light emitting element preferably has a peak wavelength in a wavelength range of not less than 360 nm and not more than 440 nm in a luminescence spectrum thereof, and the phosphor as the wavelength converting material is preferably one of or a combination of at least two of a phosphor having a peak wavelength in a blue light wavelength range of not less than 440 nm and not more than 460 nm in its luminescence spectrum, a phosphor having a peak wavelength in a green light wavelength range of not less than 510 nm and not more than 530 nm in its luminescence spectrum, and a phosphor having a peak wavelength in a red light wavelength range of not less than 585 nm and not more than 630 nm in its luminescence spectrum.

The above combination exhibits uniform luminescence upon exposure to ultraviolet energy emitted from LED and, thus, is free from the occurrence of non-uniformity of the emitted light. Further, in this combination, for example, a white light, which is closer to natural light and is excellent in color rendering properties, rather than an unnatural white color called pseudo white, can be provided. Thus, the above combination is particularly preferred.

Blue Light Emitting Phosphor

In the present invention, preferably, the blue light emitting phosphor has a peak wavelength in a blue light wavelength range of not less than 440 nm and not more than 460 nm in a luminescence spectrum thereof. Specific examples of such preferred blue light emitting phosphors include europium activated halophosphate phosphors represented by general formula (I).

$$(Sr_{1-x-y}Ba_xCa_yEu_z)_{10}(PO_4)_6 \cdot Cl_2 \qquad (I)$$

wherein x, y, and z are x<0.2, y<0.1, and 0.005<z<0.1, respectively; and, in this formula (I), x and y include 0 (zero).

In the present invention, particularly preferred blue light emitting phosphors include the following phosphors.

$$(Sr_{0.99}Eu_{0.01})_{10}(PO_4)_6 \cdot Cl_2 \qquad (1)$$

$$(Sr_{0.97}Ca_{0.02}Eu_{0.01})_{10}(PO_4)_6 \cdot Cl_2 \qquad (2)$$

$$(Sr_{0.97}Eu_{0.01})_{10}(PO_4)_6 \cdot Cl_2 \qquad (3)$$

$$(Sr_{0.75}Ba_{0.23}Ca_{0.01}Eu_{0.01})_{10}(PO_4)_6 \cdot Cl_2 \qquad (4)$$

$$(Sr_{0.98}Eu_{0.02})_{10}(PO_4)_6 \cdot Cl_2 \qquad (5)$$

$$(Sr_{0.99}Eu_{0.03})_{10}(PO_4)_6 \cdot Cl_2 \qquad (6)$$

In the present invention, (1) $(Sr_{0.99}Eu_{0.01})_{10}(PO_4)_6 \cdot Cl_2$ is particularly preferred.

Green Light Emitting Phosphor

In the present invention, preferred green light emitting phosphors have a peak wavelength in a green light wavelength range of not less than 510 nm and not more than 530 nm in a luminescence spectrum thereof. Specific examples of such preferred green light emitting phosphors include europium and manganese activated aluminate phosphors represented by general formula (II).

$$(Ba_{1-x-y-z}Sr_xCa_yEu_z)(Mg_{1-u}Mn_u)Al_{10}O_{17} \qquad (II)$$

wherein x, y, z, and u are x<0.5, y<0.1, 0.15<z<0.4, and 0.3<u<0.6, respectively; and, in this formula (II), x and y include 0 (zero).

In the present invention, particularly preferred green light emitting phosphors include the following phosphors.

$$(Ba_{0.726}Eu_{0.274})(Mg_{0.65}Mn_{0.35})Al_{10}O_{17} \qquad (1)$$

$$(Ba_{0.726}Eu_{0.274})(Mg_{0.50}Mn_{0.50})Al_{10}O_{17} \qquad (2)$$

$$(Ba_{0.25}Sr_{0.475}Eu_{0.275})(Mg_{0.55}Mn_{0.45})Al_{10}O_{17} \qquad (3)$$

$$(Ba_{0.756}Eu_{0.274})(Mg_{0.55}Mn_{0.45})Al_{10}O_{17} \qquad (4)$$

$$(Ba_{0.756}Eu_{0.274})(Mg_{0.65}Mn_{0.35})Al_{10}O_{17} \qquad (5)$$

$$(Ba_{0.35}Sr_{0.375}Eu_{0.275})(Mg_{0.55}Mn_{0.45})Al_{10}O_{17} \qquad (6)$$

$$(Ba_{0.75}Eu_{0.25})(Mg_{0.55}Mn_{0.45})Al_{10}O_{17} \qquad (7)$$

$$(Ba_{0.726}Eu_{0.274})(Mg_{0.55}Mn_{0.45})Al_{10}O_{17} \qquad (8)$$

In the present invention, (1) $(Ba_{0.756}Eu_{0.274})(Mg_{0.65}Mn_{0.35})Al_{10}O_{17}$ is particularly preferred.

Red Light Emitting Phosphor

In the present invention, preferred red light emitting phosphors have a peak wavelength in a red light wavelength range of not less than 585 nm and not more than 630 nm in a luminescence spectrum thereof. Specific examples of such preferred red light emitting phosphors include europium and samarium activated rare earth oxysulfide phosphors represented by general formula (III).

$$M_2O_2S:Eu^{3+}_{1-x},Sm^{3+}_x \qquad (III)$$

wherein x is x<0.5; M represents at least one element selected from Y, La, Ga, and Gd; and, in this formula (III), x includes 0 (zero).

In the present invention, particularly preferred red light emitting phosphors include the following phosphors.

$$La_2O_2S:Eu^{3+}{}_{0.95},Sm^{3+}{}_{0.05} \quad (1)$$

$$Y_2O_2S:Eu^{3+} \quad (2)$$

$$La_2O_2S:Eu^{3+} \quad (3)$$

$$Y_2O_2S:Eu^{3+}{}_{0.95},Sm^{3+}{}_{0.05} \quad (4)$$

In the present invention, (1) $La_2O_2S:Eu^{3+}{}_{0.95},Sm^{3+}{}_{0.05}$ is particularly preferred.

Transparent Resin Material

Any appropriate transparent resin material, which can disperse the above phosphor particles, can be used as the transparent resin material. Specific examples of preferred transparent resin materials include epoxy resins, urethane resins, silicone resins, modified epoxy resins, and modified silicone resins. Among them, silicone resins are particularly preferred.

Wavelength Converting Material Layer

The wavelength converting material layer according to the present invention is formed of a dispersion, in the transparent resin material, of the wavelength converting material, comprising at least one of three types of phosphors which, upon absorption of ultraviolet light emitted from the ultraviolet semiconductor light emitting element, emit red light, blue light, and green light, respectively.

In the wavelength converting material layer, any one of the three types of phosphors, which emit red light, blue light and green light, respectively, may be dispersed in an identical wavelength converting material layer. Alternatively, two or more phosphors of the three types of phosphors, which emit red light, blue light and green light, respectively, may be dispersed in an identical wavelength converting material layer.

In the present invention, the wavelength converting material layer may be formed by any method without particular limitation. Preferred methods for wavelength converting material layer formation include a method in which phosphor powders for respective colors each are mixed with a transparent resin material to produce mixtures followed by mixing of the mixtures for respective colors to produce a mixed phosphor, and a method in which phosphor powders for respective colors are previously mixed together followed by mixing of the phosphor mixture with a transparent resin material to produce a mixed phosphor.

The thickness of the wavelength converting material layer may be properly determined depending, for example, upon specific type and particle diameter of the wavelength converting material, filling density of the wavelength converting material, and other conditions, but is preferably not less than 0.3 mm and not more than 3.0 mm, particularly preferably not less than 0.5 mm and not more than 2.0 mm.

<Light Intensity Difference Reducing Layer>

The light intensity difference reducing layer in the semiconductor light emitting device according to the present invention functions to homogenize light produced mainly in the ultraviolet semiconductor light emitting element during the passage of the light through the light intensity difference reducing layer and to allow the homogenized light to reach the wavelength converting material layer.

In the conventional semiconductor light emitting device not provided with the light intensity difference reducing layer, the non-uniformity of emitted light in the ultraviolet semiconductor light emitting element per se and a difference in intensity of excitation energy due to the presence or absence of the ultraviolet semiconductor light emitting element as such are reflected resulting in non-uniformity of the emitted light intensity also in the wavelength converting material layer. By contrast, in the semiconductor light emitting device provided with a predetermined light intensity difference reducing layer according to the present invention, excitation energy passed through the light intensity difference reducing layer undergoes the homogenization of the intensity within the light intensity difference reducing layer, whereby the uniformity of light emitted from the phosphor in the wavelength converting material layer can be improved.

The light intensity difference reducing layer according to the present invention may be formed using any desired transparent resin material. Specific examples of preferred transparent resin materials include epoxy resins, urethane resins, silicone resins, modified epoxy resins, and modified silicone resins. Among them, silicone resins are particularly preferred.

The type of the transparent resin material for forming the light intensity difference reducing layer may be the same as or different from the type of the transparent resin material used for the dispersion of the wavelength converting material in the wavelength converting material layer. In the present invention, however, the use of the same type of the transparent resin material is preferred. In this case, the light intensity difference reducing layer and the wavelength converting material layer are identical or similar to each other in chemical and mechanical properties. This is advantageous in that the bonding strength between both the layers can be improved, a change in both the layers as a result of thermal and chemical influences with the elapse of time can be minimized, and both the layers can be further easily formed more reliably and efficiently.

The thickness of the light intensity difference reducing layer can be properly determined by taking into consideration, for example, the size of the ultraviolet semiconductor light emitting element, specific applications of the semiconductor light emitting device, the level of non-uniformity of light emitted from the ultraviolet semiconductor light emitting element, and a necessary light intensity difference reducing function. In the present invention, the thickness of the light intensity difference reducing layer is preferably not less than 0.3 mm and not more than 3.0 mm, particularly preferably not less than 0.5 mm and not more than 2.0 mm.

When the light intensity difference reducing layer is provided so as to cover both the ultraviolet semiconductor light emitting element and a wiring connected to the ultraviolet semiconductor light emitting element, the light intensity difference reducing layer further exhibits the function of covering and fixing both the ultraviolet semiconductor light emitting element and the wiring.

<Semiconductor Light Emitting Device>

The semiconductor light emitting device according to the present invention comprises a light intensity difference reducing layer between an ultraviolet semiconductor light emitting element and a wavelength converting material layer.

In the semiconductor light emitting device according to the present invention, preferably, the light intensity difference reducing layer is in direct contact with both the ultraviolet semiconductor light emitting element and the wavelength converting material layer. The direct contact of the light intensity difference reducing layer with both the ultraviolet semiconductor light emitting element and the wavelength converting material layer, however, is not indispensable. That is, if necessary, other layer may be interposed between the light intensity difference reducing layer and the ultraviolet semiconductor light emitting element or between the light intensity difference reducing layer and the wavelength converting material layer.

One preferred embodiment of the above semiconductor light emitting device according to the present invention is shown in FIG. 1. Other devices are also included as other preferred embodiments of the semiconductor light emitting device. FIGS. 2 and 3 show such other preferred embodiments.

FIG. 2 shows another preferred embodiment of the semiconductor light emitting device according to the present invention. The semiconductor light emitting device comprises a substrate, a plurality of ultraviolet semiconductor light emitting elements provided on the substrate, a continuous layer of a light intensity difference reducing layer covering any desired two or more ultraviolet semiconductor light emitting elements in the plurality of the ultraviolet semiconductor light emitting elements, and a continuous layer of the wavelength converting material layer covering the continuous layer of the light intensity difference reducing layer. According to the semiconductor light emitting device, the light distribution of a luminous flux can be narrowed. For example, in a backlight using an optical waveguide plate, the luminous flux can be advantageously efficiently input into a light incident face thereof.

FIG. 3 shows a further preferred embodiment of the semiconductor light emitting device according to the present invention. The semiconductor light emitting device comprises a substrate, a plurality of ultraviolet semiconductor light emitting elements provided on the substrate, a discontinuous layer of a light intensity difference reducing layer covering any desired one or at least two ultraviolet semiconductor light emitting elements in the plurality of the ultraviolet semiconductor light emitting elements, and a continuous layer of the wavelength converting material layer covering the discontinuous layer of the light intensity difference reducing layer. According to the semiconductor light emitting device, the light distribution of a luminous flux can be broadened. For example, in a downright backlight and lighting, the luminous flux can be advantageously applied to a wide area.

In a semiconductor light emitting device 10 according to the present invention shown in FIGS. 2 and 3, a plurality of (specifically three) ultraviolet semiconductor light emitting elements 30 are provided on a substrate 20. A light intensity difference reducing layer 40 is provided on the surface of the ultraviolet semiconductor light emitting elements 30. A wavelength converting material layer 50 is provided on the surface of the light intensity difference reducing layer 40. The light intensity difference reducing layer 40 may be provided so that the plurality of the ultraviolet semiconductor light emitting elements 30 are included in the continuous light intensity difference reducing layer 40 common to the ultraviolet semiconductor light emitting elements 30 (FIG. 2). Alternatively, the light intensity difference reducing layer 40 may be provided so that the plurality of the ultraviolet semiconductor light emitting elements 30 are included in separate independent light intensity difference reducing layers 40 (FIG. 3).

FIGS. 2 and 3 show semiconductor light emitting devices in which three ultraviolet semiconductor light emitting elements are covered with a continuous layer of one wavelength converting material layer 50. In the semiconductor light emitting device according to the present invention, however, the number of ultraviolet semiconductor light emitting elements covered with the continuous layer of one wavelength converting material layer may be any desired value. The number of ultraviolet semiconductor light emitting elements covered with the continuous layer of one wavelength converting material layer is preferably 2 to 16, particularly preferably 3 to 8.

<Backlight and Display Device>

The backlight according to the present invention is characterized by comprising any one of the above semiconductor light emitting devices.

A preferred embodiment of the backlight according to the present invention is, for example, a backlight comprising one unit (one module) or two units (two modules) or more of a semiconductor light emitting device wherein a semiconductor light emitting device 1, 10 shown in FIGS. 1 to 3 constitutes a minimum unit, i.e., one unit. A backlight having desired size and area according to the present invention can be provided by repeatedly arranging the units (modules) planarly or, if necessary, three-dimensionally in a regular or irregular manner.

In the semiconductor light emitting device according to the present invention, since the size of the module is small, the number of modules which can be provided per unit area can be increased. By virtue of the fact the number of modules or the density of modules, which can be provided, is high, the brightness can be further improved.

Accordingly, the semiconductor light emitting device and backlight according to the present invention can be utilized in various applications by utilizing their excellent characteristics. The semiconductor light emitting device according to the present invention is particularly suitable for use, for example, as light emitting devices in various display devices, preferably, for example, in equipment where a reduction in size, a reduction in weight, a reduction in thickness, electric power saving, brightness high enough to realize good visibility even in sunlight, and good color rendering properties are particularly required, for example, cellular phones, personal digital assistants, electronic dictionaries, digital cameras, computers, liquid crystal televisions (TVs), and peripheral equipment of these devices.

EXAMPLES

Example 1

The semiconductor light emitting device according to the present invention shown in FIG. 1 was produced by the following process.

An ultraviolet emitting light emitting diode (LED) was die bonded to a substrate (2.0 mm in length×2.0 mm in width) with a wiring pattern electrode by using a solder paste or the like. The bonded LED chip was wire bonded with a gold wire to a wiring pattern. After the confirmation of lighting of the ultraviolet emitting LED, the ultraviolet emitting LED and the gold wire were covered with a heat curable transparent silicone resin. In covering the LED and the gold wire, a necessary amount of the silicone resin was coated by a dispenser, a mask or the like so that, after coating, the ultraviolet emitting LED was located at the center part. Thereafter, the coating was heat cured at a temperature of 100 to 150° C., and, if necessary, the procedure consisting of coating and heat curing was repeated, whereby a light intensity difference reducing layer was formed. The light intensity difference reducing layer had a size of 1.5 mm in length×1.5 mm in width and had a thickness of 0.5 mm.

Next, a phosphor-containing heat curable transparent silicone resin was coated on a surface of the light intensity difference reducing layer, and the coating was heat cured to form a wavelength converting material layer (2.0 mm in length×2.0 mm in width×1.5 mm in thickness). Thus, a semiconductor light emitting device according to the present invention was produced.

Comparative Example 1

A semiconductor light emitting device was produced in the same manner as in Example 1, except that no light intensity difference reducing layer was formed.

Example 2

A semiconductor light emitting device according to the present invention shown in FIG. 2 was produced by the following process.

Three ultraviolet emitting LEDs were die bonded to a substrate (8.0 mm in length×3.0 mm in width) with a wiring pattern electrode by using a solder paste or the like at intervals of 2.0 mm. The bonded LED chips were wire bonded with a gold wire to a wiring pattern. After the confirmation of lighting of the ultraviolet emitting LEDs, the ultraviolet emitting LEDs and the gold wires were covered with a heat curable transparent silicone resin. In covering the LEDs and the gold wires, a necessary amount of the silicone resin was coated by a dispenser, a mask or the like so that, after coating, the central ultraviolet emitting LED was located at the center part, and the three ultraviolet emitting LEDs were covered with a continuous light intensity difference reducing layer common to the three LEDs. Thereafter, the coating was heat cured at a temperature of 100 to 150° C., and, if necessary, the procedure consisting of coating and heat curing was repeated, whereby a light intensity difference reducing layer was formed. The light intensity difference reducing layer had a size of 5.5 mm in length×2.5 mm in width and had a thickness of 1.3 mm.

Next, a phosphor-containing heat curable transparent silicone resin was coated on a surface of the light intensity difference reducing layer, and the coating was heat cured to form a wavelength converting material layer (7.5 mm in length×3.0 mm in width×1.5 mm in thickness). Thus, a semiconductor light emitting device according to the present invention was produced.

Comparative Example 2

A semiconductor light emitting device was produced in the same manner as in Example 2, except that no light intensity difference reducing layer was formed.

Example 3

A semiconductor light emitting device according to the present invention shown in FIG. 3 was produced by the following process.

Three ultraviolet emitting LEDs were die bonded to a substrate (8.0 mm in length×3.0 mm in width) with a wiring pattern electrode by using a solder paste or the like at intervals of 2.0 mm. The bonded LED chips were wire bonded with a gold wire to a wiring pattern. After the confirmation of lighting of the ultraviolet emitting LEDs, the ultraviolet emitting LEDs and the gold wires were covered with a heat curable transparent silicone resin. In covering the LEDs and the gold wires, a necessary amount of the heat curable transparent silicone resin was coated by a dispenser, a mask or the like so that, after coating, the central ultraviolet emitting LED was located at the center part, and the three ultraviolet emitting LEDs were included in respective separate independent light intensity difference reducing layers. Thereafter, the coatings were heat cured at a temperature of 100 to 150° C., and, if necessary, the procedure consisting of coating and heat curing was repeated, whereby a light intensity difference reducing layer was formed. The light intensity difference reducing layer had a size of 2.5 mm in length×2.5 mm in width and had a thickness of 1.3 mm.

Next, a phosphor-containing heat curable transparent silicone resin was coated on a surface of the light intensity difference reducing layer, and the coating was heat cured to form a wavelength converting material layer (7.5 mm in length×3.0 mm in width×1.3 mm in thickness). Thus, a semiconductor light emitting device according to the present invention was produced.

Comparative Example 3

A semiconductor light emitting device was produced in the same manner as in Example 3, except that no light intensity difference reducing layer was formed.

EVALUATION

Figure 4B:
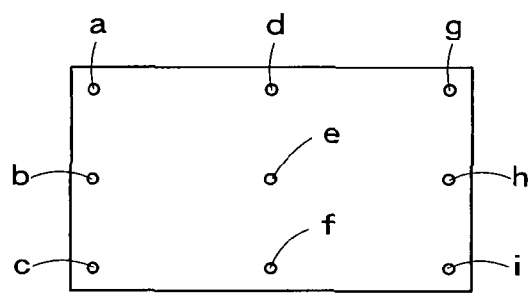

The brightness of nine measuring points on the wavelength converting material layer in each of the semiconductor light emitting devices produced in Example 1 and Comparative Example 1 (FIG. 4A), the brightness of nine measuring points on the wavelength converting material layer in each of the semiconductor light emitting devices produced in Example 2 and Comparative Example 2 (FIG. 4B), and the brightness of nine measuring points on the wavelength converting material layer in each of the semiconductor light emitting devices produced in Example 3 and Comparative Example 3 (FIG. 4B) were measured with a Two-Dimensional Luminance Colorimeter CA-2000 manufactured by KONICA MINOLTA. The brightness uniformity for each of the semiconductor light emitting devices was evaluated based on the measured brightness for the measuring points.

The results were as shown in Table 1. The numeral values in the table represent brightness ($Cd/m^2$), and the numeral values within the parentheses are relative values when the brightness at point e is presumed to be 100.

A comparison of the brightness at center point e with the brightness of each point around the point e shows that the difference in brightness between the center part and the part around the center part for each Example is smaller than the brightness difference for each Comparative Example and the light emitting devices of the Examples have uniform brightness characteristics.

TABLE 1

| | Number of LEDs | Measuring point | | | | | | | | |
|---|---|---|---|---|---|---|---|---|---|---|
| | | a | b | c | d | e | F | g | h | i |
| Ex. 1 | 1 | 23250 (83) | 25580 (91) | 23500 (84) | 26050 (93) | 28120 (100) | 25500 (91) | 24150 (86) | 26450 (94) | 23750 (84) |
| Comp. | 1 | 19700 (50) | 23850 (60) | 20050 (51) | 24260 (61) | 39450 (100) | 22450 (57) | 18850 (48) | 23950 (61) | 18000 (46) |

TABLE 1-continued

| | Number of LEDs | Measuring point | | | | | | | | |
|---|---|---|---|---|---|---|---|---|---|---|
| | | a | b | c | d | e | F | g | h | i |
| Ex. 1 | | | | | | | | | | |
| Ex. 2 | 3 | 26150 (86) | 27890 (91) | 26420 (87) | 30000 (98) | 30520 (100) | 30250 (99) | 26600 (87) | 27650 (91) | 26550 (87) |
| Comp. Ex. 2 | 3 | 27960 (68) | 28120 (69) | 27020 (66) | 38220 (93) | 40940 (100) | 38730 (95) | 25260 (62) | 25920 (63) | 24990 (61) |
| Ex. 3 | 3 | 28890 (81) | 30070 (85) | 27980 (79) | 33220 (94) | 35450 (100) | 32690 (92) | 29510 (83) | 29360 (83) | 28740 (81) |
| Comp. Ex. 3 | 3 | 24990 (59) | 25010 (59) | 26220 (62) | 38410 (91) | 42250 (100) | 38320 (91) | 25550 (60) | 25720 (61) | 25980 (61) |

Figure 5:
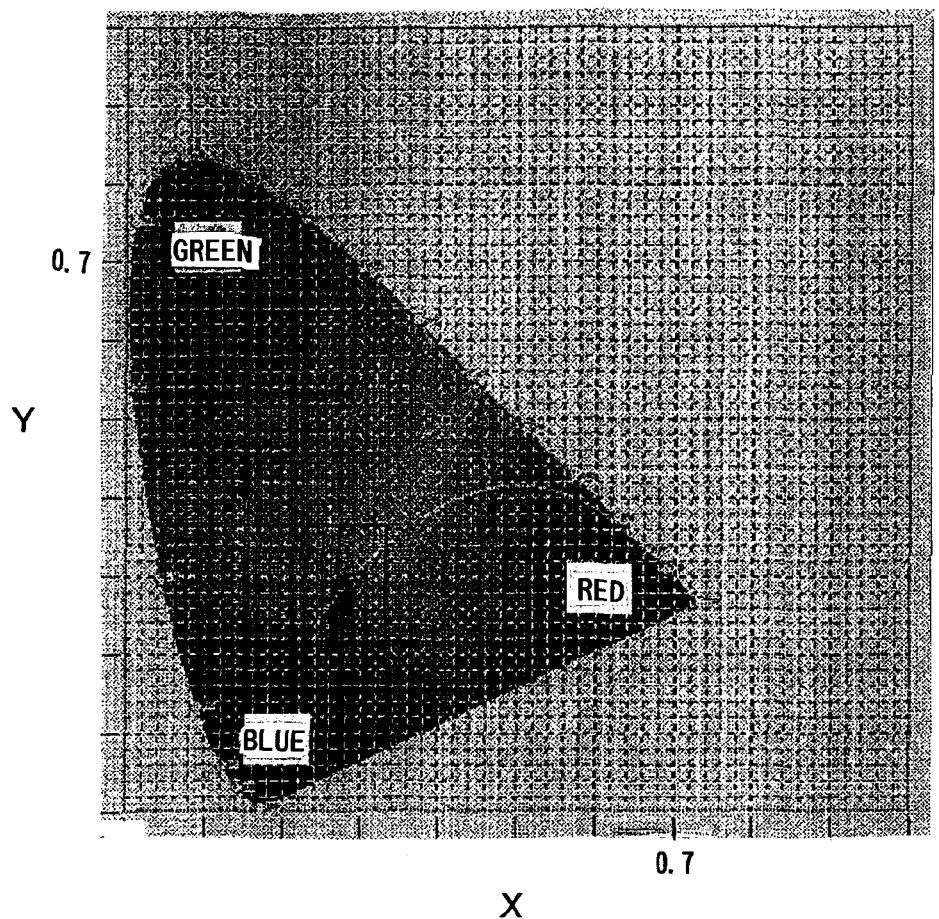
FIG. 5 is a diagram showing the results of evaluation of the color uniformity of light emitted from a semiconductor light emitting device in a working example of the present invention.
Figure 6:
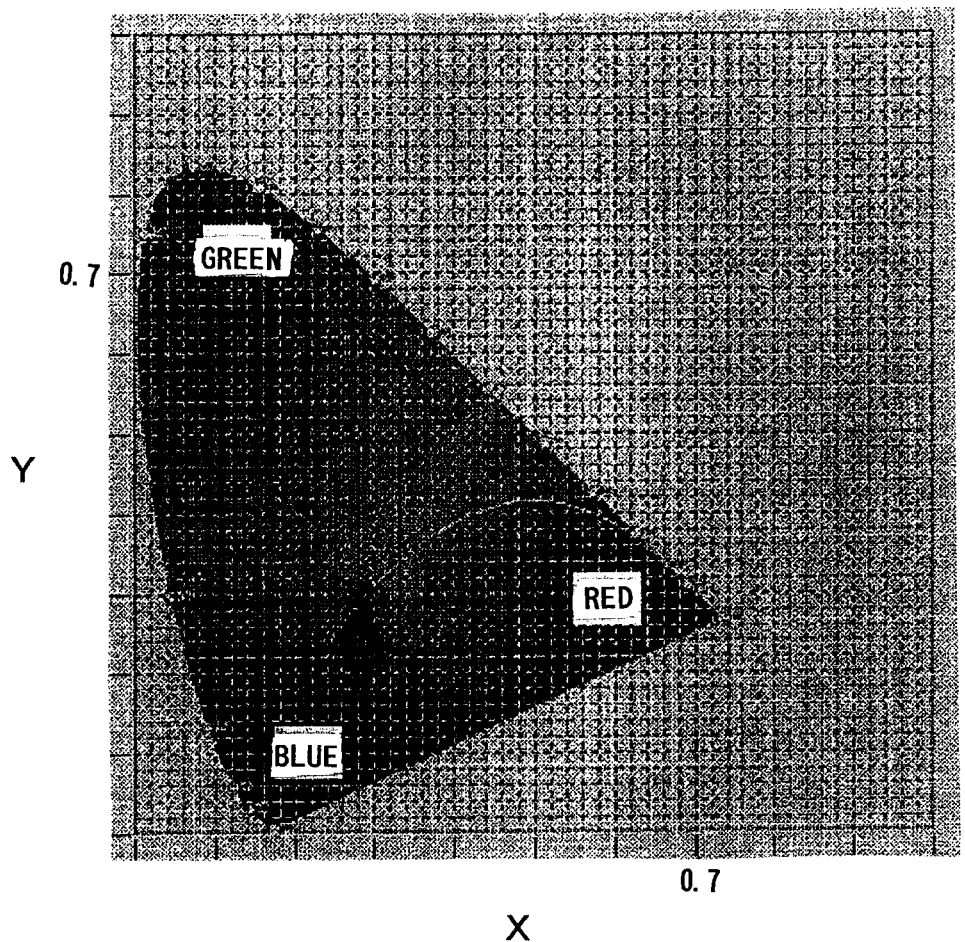
FIG. 6 is a diagram showing the results of evaluation of the color uniformity of light emitted from a semiconductor light emitting device in a comparative example.

The colors uniformity for each of the semiconductor light emitting devices produced in Example 2 and Comparative Example 2 was evaluated with a Two-Dimensional Luminance Colorimeter CA-2000 manufactured by KONICA MINOLTA. The results were as shown in FIGS. 5 and 6. An aggregation of black dots plotted in the drawings represent a variation in chromaticity of light output from the light emitting device. Data are concentrated on a white region in the center part on an xy chromaticity diagram. However, the area of a data distribution for the Example is smaller than the area of the data distribution for the Comparative Example, indicating that the non-uniformity of color for the Example is smaller than that for the Comparative Example.

The invention claimed is:

1. A semiconductor white light emitting device comprising:
an ultraviolet semiconductor light emitting element;
a wiring connected to the ultraviolet semiconductor light emitting element;
a wavelength converting material layer; and
a light intensity difference reducing layer provided between the ultraviolet semiconductor light emitting element and the wavelength converting material layer, wherein
the wavelength converting material layer contains a wavelength converting material comprising a mixture of three types of phosphors which, upon absorption of ultraviolet light emitted from the ultraviolet semiconductor light emitting element, emit red light, blue light, and green light, respectively,
the light intensity difference reducing layer is formed of a silicone resin,
the ultraviolet semiconductor light emitting element and the wiring are completely covered by the light intensity difference reducing layer, and
the blue light emitting phosphor is represented by formula (I):

$$(Sr_{1-x-y}Ba_xCa_yEu_z)_{10}(PO_4)_6Cl_2 \quad (I)$$

wherein x, y, and z are x<0.2, y<0.1, and 0.005<z<0.1, respectively.

2. The semiconductor light emitting device according to claim 1, wherein the light intensity difference reducing layer is formed of a transparent resin material.

3. The semiconductor light emitting device according to claim 1, wherein the wavelength converting material layer is formed of a dispersion, in a transparent resin material, of the wavelength converting material comprising at least one of three types of phosphors which, upon absorption of ultraviolet light emitted from the ultraviolet semiconductor light emitting element, emit red light, blue light, and green light, respectively.

4. The semiconductor light emitting device according to claim 1, wherein a plurality of the ultraviolet semiconductor light emitting elements are provided on a substrate, a continuous layer of the light intensity difference reducing layer is provided to cover any two or more of the plurality of the ultraviolet semiconductor light emitting elements, and a continuous layer of the wavelength converting material layer is provided to cover the continuous layer of the light intensity difference reducing layer.

5. The semiconductor light emitting device according to claim 1, wherein a plurality of the ultraviolet semiconductor light emitting elements are provided on a substrate, a discontinuous layer of the light intensity difference reducing layer is provided to cover any one or at least two of the plurality of the ultraviolet semiconductor light emitting elements, and a continuous layer of the wavelength converting material layer is provided to cover the discontinuous layer of the light intensity difference reducing layer.

6. A backlight comprising a semiconductor light emitting device according to claim 1.

7. A display device comprising a backlight according to claim 6.

* * * * *